United States Patent
Onishi et al.

(10) Patent No.: US 10,410,894 B2
(45) Date of Patent: Sep. 10, 2019

(54) PURGE STOCKER AND PURGING METHOD

(71) Applicant: MURATA MACHINERY, LTD., Kyoto (JP)

(72) Inventors: Shinji Onishi, Ise (JP); Masanao Murata, Ise (JP); Takashi Yamaji, Ise (JP)

(73) Assignee: Murata Machinery, Ltd., Kyoto-shi, Kyoto (JP)

( * ) Notice: Subject to any disclaimer, the term of this patent is extended or adjusted under 35 U.S.C. 154(b) by 118 days.

(21) Appl. No.: 15/319,724

(22) PCT Filed: Apr. 21, 2015

(86) PCT No.: PCT/JP2015/062132
§ 371 (c)(1),
(2) Date: Dec. 16, 2016

(87) PCT Pub. No.: WO2015/194252
PCT Pub. Date: Dec. 23, 2015

(65) Prior Publication Data
US 2017/0140949 A1    May 18, 2017

(30) Foreign Application Priority Data
Jun. 16, 2014   (JP) ................. 2014-123376

(51) Int. Cl.
*H01L 21/673* (2006.01)
*H01L 21/67* (2006.01)
(Continued)

(52) U.S. Cl.
CPC .............. *H01L 21/673* (2013.01); *B08B 9/08* (2013.01); *G05D 7/0635* (2013.01);
(Continued)

(58) Field of Classification Search
None
See application file for complete search history.

(56) References Cited

U.S. PATENT DOCUMENTS

| 2008/0156069 A1 | 7/2008 | Murata et al. |
| 2009/0053017 A1 | 2/2009 | Shmuelov |

(Continued)

FOREIGN PATENT DOCUMENTS

| JP | 2010-182747 A | 8/2010 |
| JP | 2013-131712 A | 7/2013 |
| JP | 2015-073062 A | 4/2015 |

OTHER PUBLICATIONS

European Search Report for related EP Application No. 15810199.8, dated Feb. 1, 2018; 8 pages.
(Continued)

*Primary Examiner* — Nicole Blan
(74) *Attorney, Agent, or Firm* — Procopio, Cory, Hargreaves & Savitch LLP

(57) ABSTRACT

A purge stocker includes a first supply unit including N first purge apparatuses, each having a first supply unit configured to support a storage container, a first supply pipe configured to supply the purge gas into the storage container supported by the first supporting unit, and a first flow rate adjusting unit configured to adjust the flow rate of the purge gas in the first supply pipe; and a second supply unit including M second purge apparatuses, each having a second supporting unit configured to support the storage container and a second supply pipe configured to supply the purge gas into the storage container supported by the second supporting unit. When the storage containers are supported by a certain number of second supporting units, the second supply unit supplies the storage containers with the purge gas through the respective second supply pipes.

9 Claims, 10 Drawing Sheets

(51) Int. Cl.
*H01L 21/677* (2006.01)
*B08B 9/08* (2006.01)
*G05D 7/06* (2006.01)

(52) U.S. Cl.
CPC .. *H01L 21/67294* (2013.01); *H01L 21/67389* (2013.01); *H01L 21/67393* (2013.01); *H01L 21/67769* (2013.01)

(56) References Cited

U.S. PATENT DOCUMENTS

| | | |
|---|---|---|
| 2014/0000757 A1 | 1/2014 | Takahara et al. |
| 2014/0014227 A1 | 1/2014 | Shin et al. |
| 2014/0112739 A1 | 4/2014 | Hirano et al. |

OTHER PUBLICATIONS

International Search Report and Written Opinion for PCT App No. PCT/JP2015/062132 dated Jun. 9, 2015, 10 pgs.

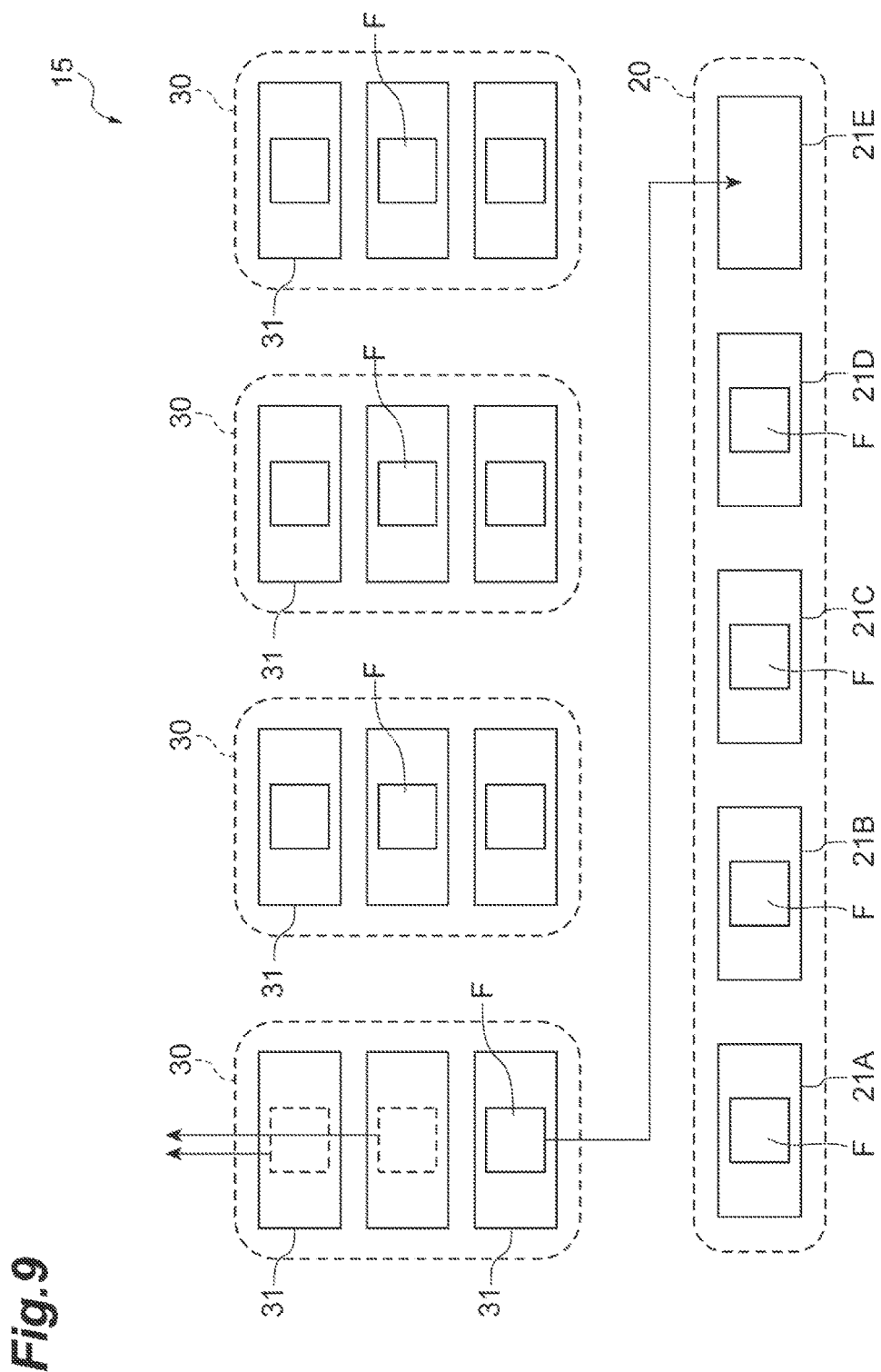

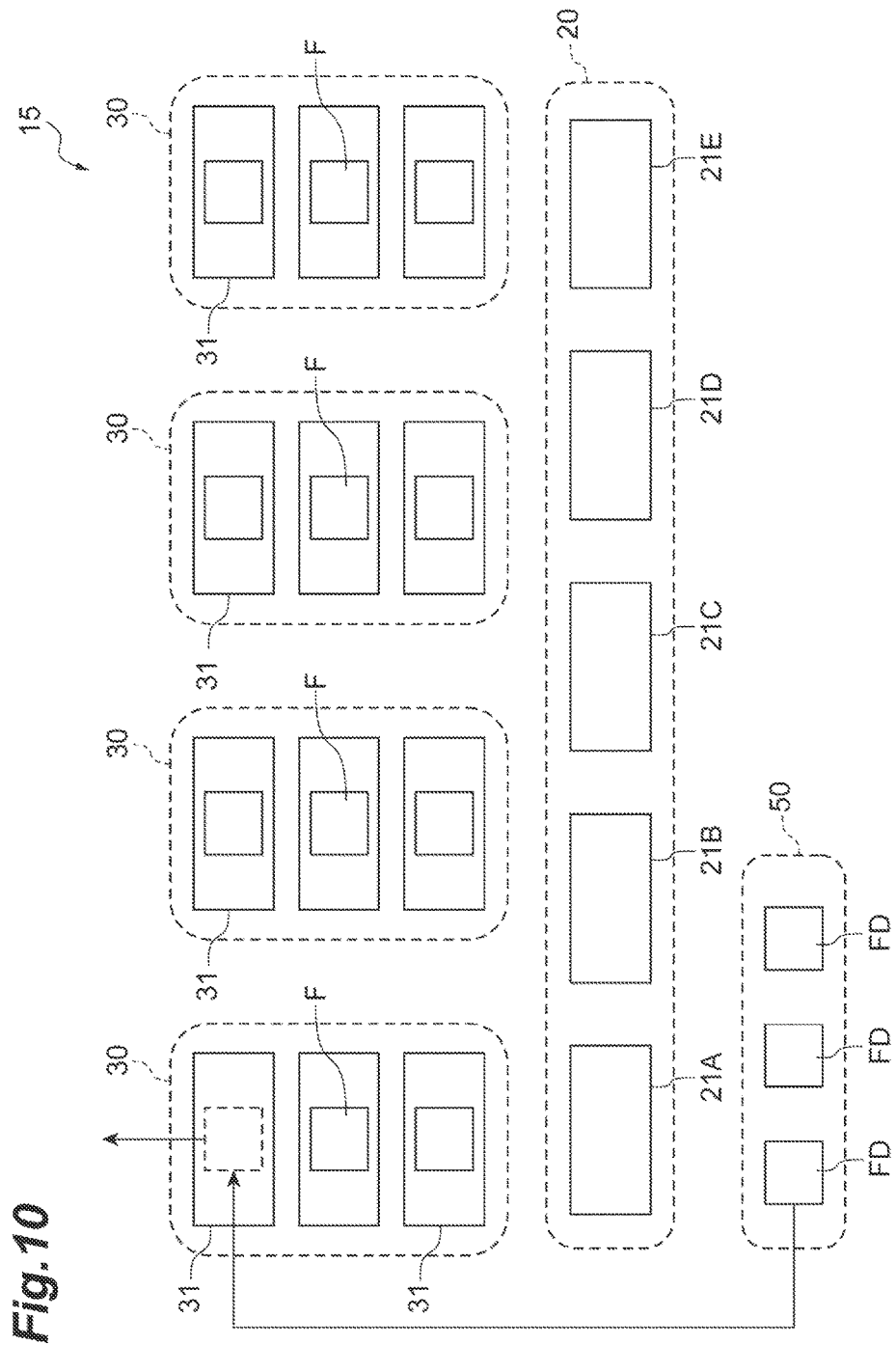

PURGE STOCKER AND PURGING METHOD

This application is a National Stage entry of PCT Application No. PCT/JP2015/062132, filed on Apr. 21, 2015, which claims priority to Japanese Patent Application No. 2014-123376, filed on Jun. 16, 2014, the contents of which is incorporated herein by reference in its entirety.

TECHNICAL FIELD

The present invention relates to a purge stocker and a purging method.

BACKGROUND ART

A related art purge stocker includes a purge system described in Patent Literature 1. The purge system described in Patent Literature 1 includes a primary storage unit having an automatic purging mechanism that supplies purge gas at a first gas flow rate and a secondary storage unit that has an automatic purging mechanism supplying purge gas at a second gas flow rate that is lower than the first gas flow rate. With the purge system, a container having been disposed in the primary storage unit over a certain period is transferred to the secondary storage unit by a transferring mechanism. This configuration enables the purge system to reduce the consumption of purge gas.

CITATION LIST

Patent Literature

[Patent Literature 1] Japanese Unexamined Patent Publication No. 2010-182747

SUMMARY OF INVENTION

Technical Problem

The automatic purging mechanism included in the secondary storage unit has a purge valve supplying purge gas upon placement of a container. The purge valve has an actuator. When the actuator operates upon placement of a container, a supply pipe and a gas channel provided in the actuator are connected with each other. Purge gas is accordingly supplied into the container. With this configuration, the secondary storage unit can prevent unnecessary discharge of purge gas using the purge valve and thus can reduce the consumption of purge gas. However, this approach problematically renders the configuration more complicated. The purge nozzle is not necessary if an electromagnetic valve or a mass flow controller (MFC) is provided to the supply pipe of the secondary storage unit. However, this approach increases the cost of the device and renders the configuration more complicated.

It is therefore an object of the present invention to provide a purge stocker and a purging method allowing a simple configuration of the device while reducing the consumption of purge gas.

Solution to Problem

A purge stocker according to the present invention purges the inside of a storage container storing a product with purge gas. The purge stocker includes a first supply unit including N first purge apparatuses (N is an integer equal to or larger than 2), each having a first supporting unit configured to support the storage container, a first supply pipe configured to supply the purge gas into the storage container supported by the first supporting unit, and a first flow rate adjusting unit configured to adjust the flow rate of the purge gas in the first supply pipe; a second supply unit including M second purge apparatuses (M is a positive integer equal to or smaller than N), each having a second supporting unit configured to support the storage container, and a second supply pipe configured to supply the purge gas into the storage container supported by the second supporting unit; and a transferring device configured to transfer the storage container between the first supply unit and the second supply unit. In this configuration, when the storage containers are supported by a certain number of second supporting units, the second supply unit supplies the storage containers with the purge gas through the respective second supply pipes.

In the purge stocker, when the storage containers are supported by a certain number of second supporting units, the second supply unit supplies the storage containers with the purge gas through the respective second supply pipes. In other words, in the second supply unit, if fewer second supporting units than the certain number are supporting the respective storage containers, no purging is performed. This configuration can prevent a large amount of purge gas from being discharged from the second supply pipes of the second supporting units supporting no storage containers, which can reduce the consumption of purge gas. Furthermore, no purge nozzles in a complicated configuration are necessary, which can make the configuration simple. The certain number is, for example, equal to or greater than 80% of M. In referring to the state that the storage container is supported, in addition to the case that the storage container is actually being supported by the supporting unit, such a case is further included that the storage container is determined to be supported by the supporting unit, for example, that a transfer instruction is output to the transferring device.

In an embodiment, when all of the second supporting units in M second purge apparatuses support respective storage containers, the second supply unit may supply the storage containers with the purge gas through the second supply pipes. This configuration can prevent unnecessary discharge of purge gas and thus can reduce the consumption of purge gas. In this case, all the second supporting units of the second purge apparatuses support the storage containers, thereby balancing pressure loads and thus more accurately supplying the purge gas to the storage containers.

In an embodiment, when the number of storage containers that have been supplied with the purge gas at a certain flow rate for a certain period reaches M in the first supply unit, the transferring device may transfer the M storage containers from the first supply unit to the second supply unit. When the M storage containers have been transferred, the second supply unit may supply the storage containers with the purge gas through the second supply pipes. Storage containers to which the purge gas have been supplied at a certain flow rate for a certain period are sequentially transferred from the first supply unit to the second supply unit, which may, however, take some time until all the second supporting units of the second purge apparatuses support the respective storage containers. In this case, no purge gas is supplied to the storage containers that had been earlier transferred to the second supply unit, until the transferring of the remaining storage containers is completed. When the number of storage containers that had been supplied with the purge gas at a certain flow rate for a certain period reaches M in the first supply unit, the storage containers are transferred to the second supply unit. This process can reduce the time during which no purge gas is supplied to the storage containers. In referring to completion of transfer of storage containers, in addition to the case that the transfer of the storage container is actually completed, such a case is further included that M storage containers are determined to be transferred, for example, such that a transfer instruction is output to the transferring device.

In an embodiment, the second supply unit may include a main pipe connected to the second supply pipes and configured to supply the purge gas to the second supply pipes, and a second flow rate adjusting unit configured to adjust the flow rate of the purge gas in the main pipe. This configuration allows adjustment of the flow rate of the purge gas supplied to the second supply pipes. In this configuration, the main pipe has a single second flow rate adjusting unit, which makes the configuration simple and thus can control an increase in the cost compared with such a configuration that has a flow rate adjusting unit for the second supply pipes.

In an embodiment, the second flow rate adjusting unit may adjust the flow rate of the purge gas in the main pipe to a set flow rate determined based on the number of storage containers connected with the second supply pipes in the second supply unit. This configuration enables each of the storage containers to be supplied with a constant amount of the purge gas. When purging fewer storage containers than M in the second supply unit, the purge gas is set at a flow rate increased from the flow rate of when M storage containers are connected with the second supply pipes. This configuration enables each storage container to be supplied with a constant amount of the purge gas, even when the purge gas is discharged from the second supply pipe connected with no storage containers.

In an embodiment, when starting supplying the purge gas to the storage container, a first flow rate adjusting unit may increase the flow rate of the purge gas in the first supply pipe in a continuous or stepwise manner to obtain a certain supply flow rate. This configuration can reduce dust swirling inside the storage container when starting supplying the purge gas.

In an embodiment, when at least one of the storage containers is delivered out of the second supply unit, the transferring device may transfer as many storage containers as the delivered storage containers from the first supply unit to the second supply unit. With this configuration, the second supply unit always includes M storage containers. Consequently, the purge gas can be supplied to the storage containers with all the second supply pipes connected with the respective storage containers. This configuration can therefore reduce the consumption of the purge gas and accurately supply the purge gas to the storage containers.

In an embodiment, the device may have one or more empty storage containers storing no products. When at least one of the storage containers is delivered out of the second supply unit, the transferring device may transfer as many empty storage containers as the delivered storage containers to the second supply unit. With this configuration, the second supply unit always includes M storage containers. Consequently, the purge gas is supplied to the storage containers with all the second supply pipes connected with the respective storage containers. Consequently, a constant amount of the purge gas is supplied to each storage container in satisfactory conditions.

A purging method according to the present invention is a method for a purge stocker purging the inside of a storage container storing a product with purge gas. The purge stocker includes a first supply unit including N first purge apparatuses (N is an integer equal to or larger than 2) each having a first supporting unit configured to support the storage container, a first supply pipe configured to supply the purge gas into the storage container supported by the first supporting unit, and a first flow rate adjusting unit configured to adjust the flow rate of the purge gas in the first supply pipe; a second supply unit including M second purge apparatuses (M is a positive integer equal to or smaller than N) each having a second supporting unit configured to support the storage container and a second supply pipe configured to supply the purge gas into the storage container supported by the second supporting unit; and a transferring device configured to transfer the storage container between the first supply unit and the second supply unit. In the purging method, when the storage containers are supported by a certain number of second supporting units, the second supply unit supplies the storage containers with the purge gas through respective second supply pipes.

With the purging method, when the storage containers are supported by a certain number of second supporting units, the purge gas is supplied to the storage containers from the respective second supply pipes in the second supply unit. In other words, in the second supply unit, when fewer second supporting units than the certain number are supporting the storage containers, no purging is performed. This configuration can prevent a large amount of purge gas from being discharged from the second supply pipe of the second supporting unit supporting no storage containers, which can reduce the consumption of purge gas. In addition, no purge nozzles in a complicated configuration are necessary, which enables purging with a simple configuration.

Advantageous Effects of Invention

According to the present invention, more efficient purging can be achieved.

BRIEF DESCRIPTION OF DRAWINGS

FIG. 9 is an illustrative drawing for an operation of purging in the purge stocker.

FIG. 10 is an illustrative drawing for an operation of purging in the purge stocker.

DESCRIPTION OF EMBODIMENTS

A preferred embodiment of the present invention will be described below with reference to the drawings. In the description of the drawings, like numerals indicate like or corresponding components, and overlapping description will be omitted.

Figure 1:
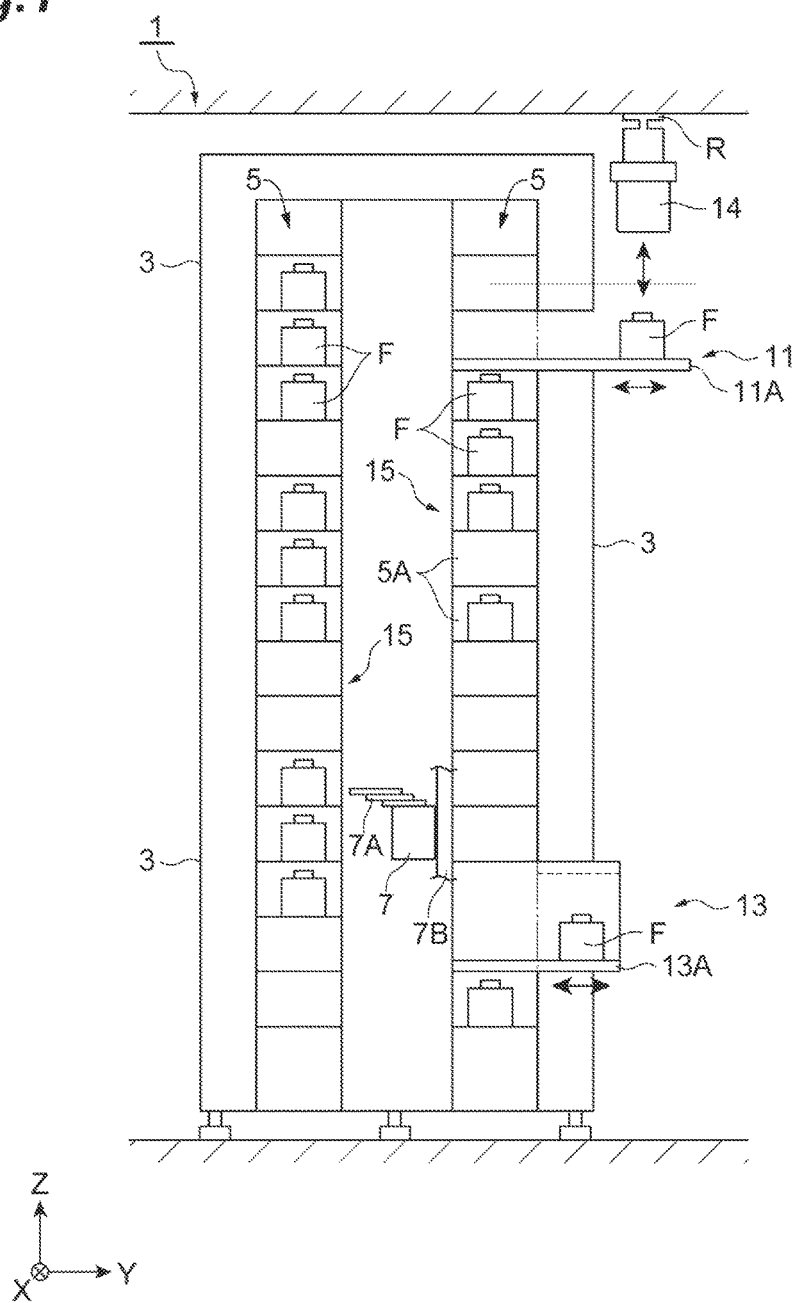
FIG. 1 is a drawing illustrating a purge stocker according to an embodiment.

A purge stocker 1 illustrated in FIG. 1 purges the inside of a storage container F, examples of which include a front opening unified pod (FOUP) storing a product such as a semiconductor wafer and a glass substrate, with purge gas (for example, nitrogen gas) while serving as a stocker storing a plurality of storage containers F. Purging is processing for keeping the FOUP storing a product clean by ejecting the purge gas inside the FOUP. The purge stocker 1 is installed, for example, in a clean room (not illustrated).

Figure 2:
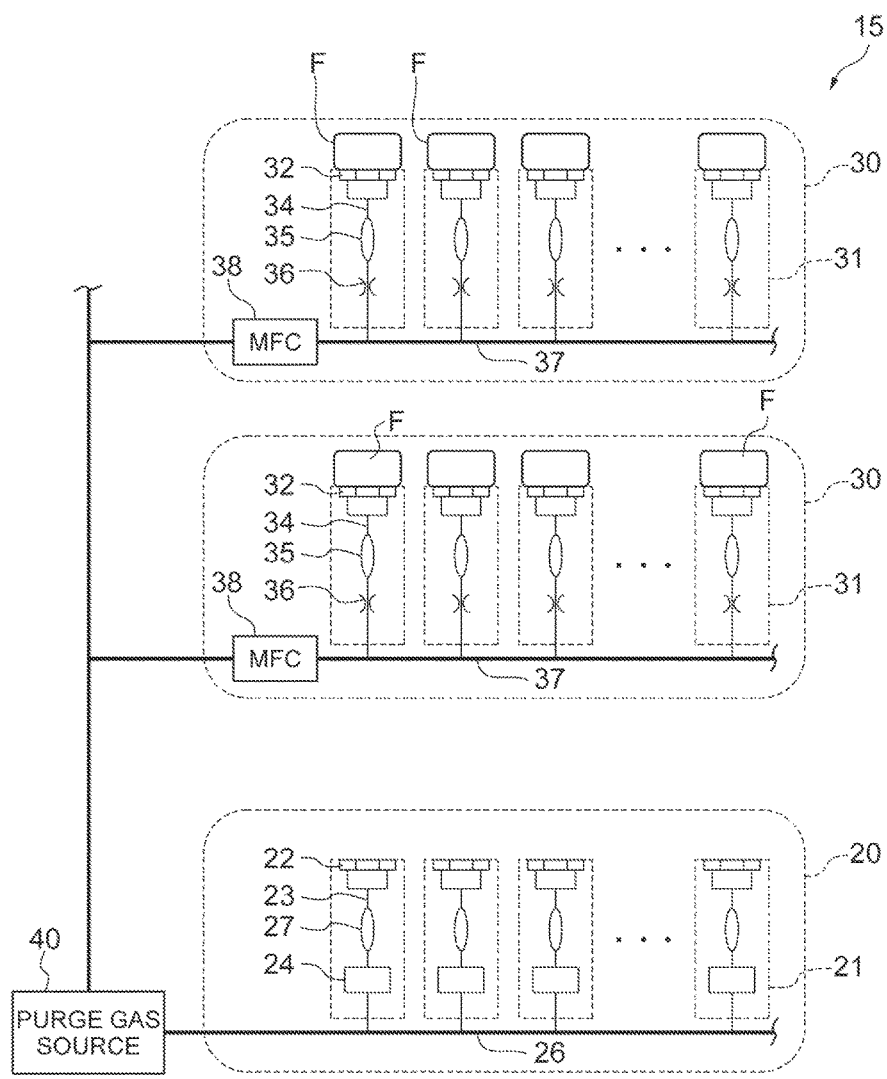
FIG. 2 is a drawing illustrating the configuration of a purge system.
Figure 3:
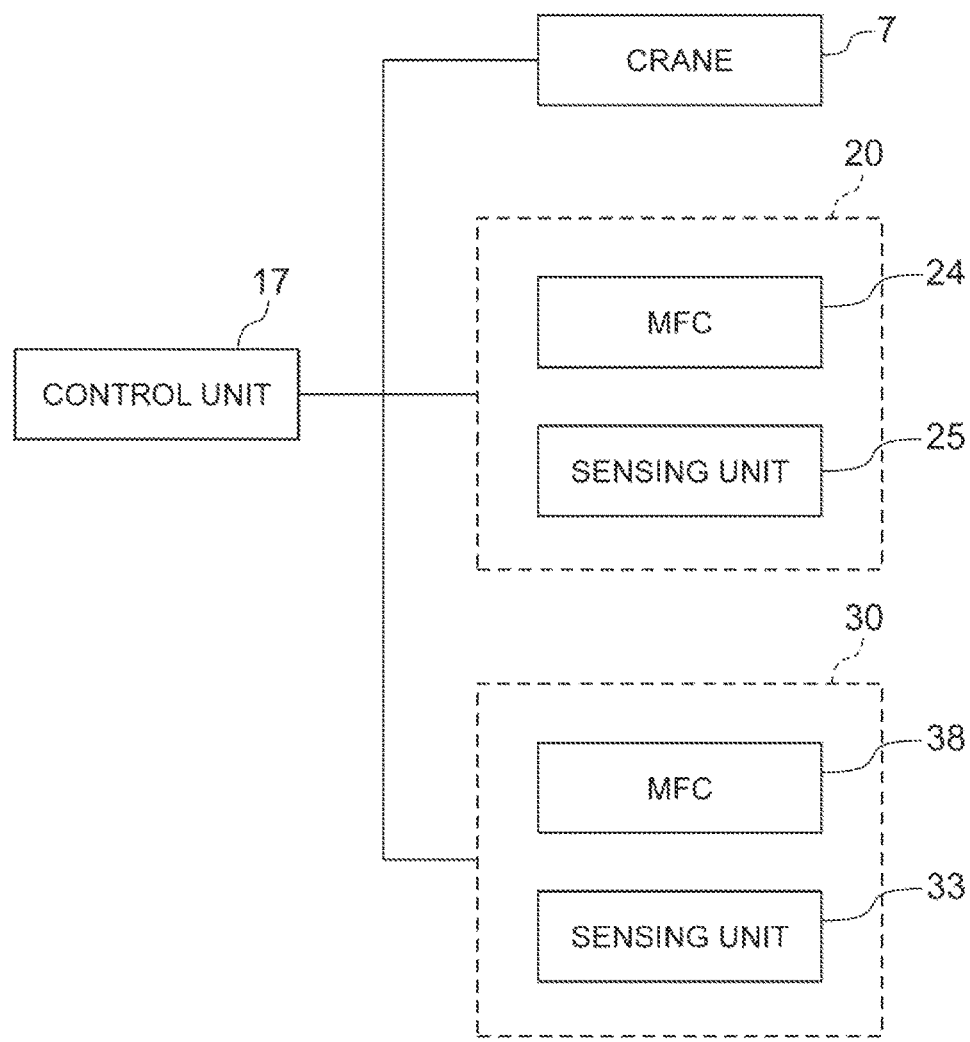
FIG. 3 is a drawing illustrating the configuration of the purge stocker.

As illustrated in FIGS. 1 to 3, the purge stocker 1 includes a partition 3, racks 5, a crane (a transferring device) 7, an OHT port 11, a manual port 13, purge systems 15, and a control unit 17.

The partition 3 is a covering plate of the purge stocker 1 and forms a storage area storing the storage containers F inside the partition 3. The racks 5 are parts for retaining the storage containers F, and one or two rows (two rows in this example) of racks 5 are usually provided in the storage area. The racks 5 extend in a certain direction X and are disposed substantially parallel to each other, such that two adjacent racks 5, 5 are opposite to each other. Each rack 5 has a plurality of storage shelves 5A, which keep storage containers F in a manner having the storage containers F placed (supported) thereon, along the certain direction X and the vertical direction Z.

The crane 7 is a mechanism for loading and unloading storage containers F into/from the storage shelves 5A and transferring the storage containers F between the storage shelves 5A. The crane 7 is disposed in a region between the racks 5, 5 opposite to each other. The crane 7 runs on a transport rail (not illustrated) set on the floor surface along the certain direction X of the rack 5, thereby moving in the certain direction X along the rack 5. A stage 7A of the crane 7 is movable upward and downward along a guide rail 7B such that storage containers F are loaded onto and unloaded from a plurality of storage shelves 5A aligned in the vertical direction. Operations of the crane 7 are controlled by the control unit 17.

The storage container F is loaded into, and unloaded from, the purge stocker 1 through an overhead hoist transfer (OHT) port 11 and a manual port 13. The OHT port 11 delivers the storage container F between the purge stocker 1 and a ceiling vehicle 14 (OHT) running on a transport rail R set on the ceiling and has a conveyor 11A for conveying the storage container F. The manual port 13 delivers the storage container F between the operator and the purge stocker 1, and has a conveyor 13A for conveying the storage container F. Operations of the conveyor 11A of the OHT port 11 and the conveyor 13A of the manual port 13 are controlled by the control unit 17.

The purge system 15 includes a first supply unit 20 and a second supply unit 30. The purge system 15 of this embodiment has a first supply unit 20 and a plurality of second supply units 30.

The first supply unit 20 has N first purge apparatuses 21. N is an integer equal to or larger than 2. The first purge apparatus 21 includes a placing unit (a first supporting unit) 22 having the storage container F placed thereon, a supply pipe (a first supply pipe) 23 for supplying the purge gas to the storage container F placed on the placing unit 22, and a mass flow controller (MFC, a first flow rate adjusting unit) 24 for adjusting the flow rate of the purge gas in the supply pipe 23.

The placing unit 22 is disposed on the storage shelf 5A. The placing unit 22 has a sensing unit 25 (see FIG. 3) sensing that the storage container F is placed on the placing unit 22. An example of the sensing unit 25 includes an optical sensor sensing the presence of the storage container F. Upon sensing the presence of the storage container F, the sensing unit 25 outputs a sensing signal informing that the storage container F has been placed on the placing unit 22 to the control unit 17. The placing unit 22 has a purge nozzle (not illustrated) at a position corresponding to a purge gas introducing unit (not illustrated), provided to the storage container F in the state that the storage container F is placed on the placing unit 22. When the storage container F is placed on the placing unit 22, the purge nozzle and the purge gas introducing unit are aligned with each other. With this process, the purge gas is ready to be supplied.

The supply pipe 23 is connected to a main pipe 26. Specifically, the supply pipe 23 has an end connected to the purge nozzle and another end connected to the main pipe 26. The main pipe 26 is connected to a purge gas source 40. The main pipe 26 is supplied with the purge gas from the purge gas source 40. The purge gas source 40 is a tank for storing the purge gas.

The supply pipe 23 has a particle filter 27. The particle filter 27 is a filter capable of collecting dust (particles).

The MFC 24 is an apparatus for measuring the mass flow rate of the purge gas traveling through the supply pipe 23 and controlling the flow rate. The flow rate control by the MFC 24 is controlled by the control unit 17. Specifically, the MFC 24 receives a signal output from the control unit 17, and controls the flow rate of the purge gas in the supply pipe 23 in response to the signal.

The second supply unit 30 includes M second purge apparatuses 31. M is a positive integer equal to or smaller than N. The second purge apparatus 31 includes a placing unit (a second supporting unit) 32 having the storage container F placed thereon and a supply pipe (a second supply pipe) 34 supplying the purge gas to the storage container F placed on the placing unit 32.

The placing unit 32 is disposed on the storage shelf 5A. The placing unit 32 is provided with a sensing unit 33 (see FIG. 3) which senses that the storage container F is placed on the placing unit 32. An example of the sensing unit 33 includes an optical sensor sensing the presence of the storage container F. Upon sensing the presence of the storage container F, the sensing unit 33 outputs a sensing signal which informs that the storage container F has been placed on the placing unit 32 to the control unit 17. The placing unit 32 has a purge nozzle (not illustrated) at a position corresponding to the purge gas introducing unit provided to the storage container F in the state that the storage container F is placed on the placing unit 32. When the storage container F is placed on the placing unit 32, the purge nozzle and the purge gas introducing unit are aligned with each other. With this process, the purge gas is ready to be supplied.

The supply pipe 34 has a particle filter 35 and an orifice 36. The orifice 36 adjusts the flow rate of the purge gas supplied from the supply pipe 34 in such a manner that a plurality of supply pipes 34 have the same flow rate. The supply pipes 34 are connected to a main pipe 37. Specifically, the supply pipe 34 has an end connected to the purge nozzle and the other end connected to the main pipe 37. The main pipe 37 is connected to the purge gas source 40. The main pipe 37 is supplied with the purge gas from the purge gas source 40.

The main pipe 37 has an MFC (a second flow rate adjusting unit) 38 adjusting the flow rate of the purge gas in the main pipe 37. Specifically, the MFC 38 is disposed, on the main pipe 37, upstream of the points where the supply pipes 34 are connected to the main pipe 37.

The MFC 38 is an apparatus for measuring the mass flow rate of the purge gas traveling through the main pipe 37 and controlling the flow rate. The flow rate control by the MFC 38 is controlled by the control unit 17. Specifically, the MFC 38 receives a signal output from the control unit 17 and controls the flow rate of the purge gas in the main pipe 37, in response to the signal.

The control unit 17 intensively controls operations of the purge stocker 1. The control unit 17 is an electronic control unit configured with a central processing unit (CPU), a read only memory (ROM), a random access memory (RAM), and others.

The control unit 17 controls operations of the crane 7. The control unit 17 controls the crane 7 based on the move-in and move-out information of the storage container F (information instructing loading and unloading of the storage container F) transmitted from an upper controller (not illustrated). The control unit 17 further controls the crane 7 to transfer the storage container F between the first supply unit 20 and the second supply unit 30 based on the status of purging performed on the storage container F in the first supply unit 20 and the second supply unit 30. The control unit 17 outputs a delivery signal that provides instruction for operation of the crane 7, to the crane 7.

Figure 7:
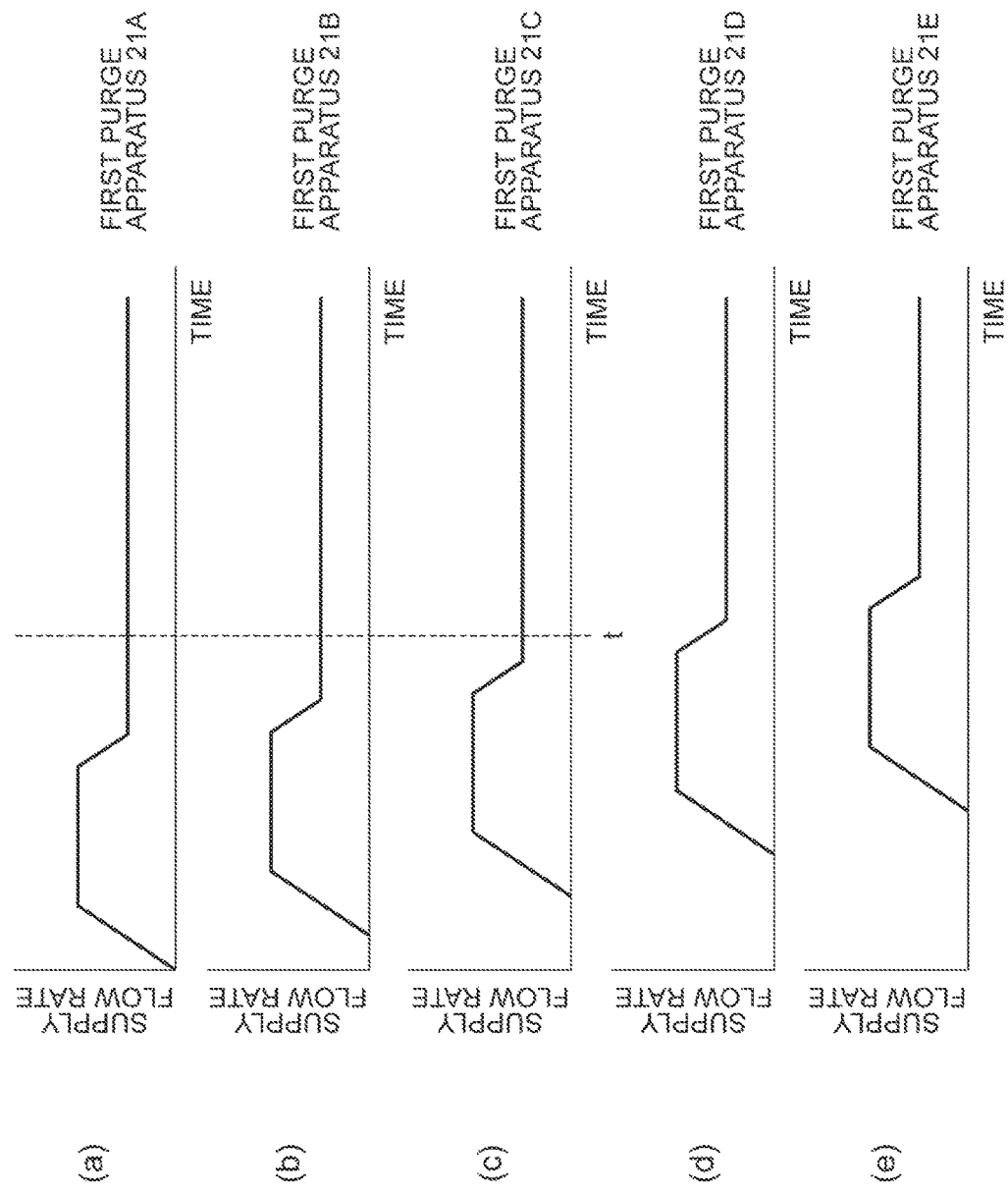
FIG. 7 is an illustrative drawing for an operation of purging in the purge stocker.

The control unit 17 controls operations of the MFC 24. For supplying the purge gas at a target supply flow rate to the storage container F placed on the placing unit 22, the control unit 17 controls the MFC 24 and adjusts the flow rate of the purge gas in the supply pipe 23 to the target supply flow rate. The control unit 17 controls the MFC 24 to gradually (continuously) increase the flow rate of the purge gas in the supply pipe 23 until the target supply flow rate is obtained. More specifically, as illustrated in FIG. 7, the control unit 17 controls the MFC 24 to continuously increase the flow rate of the purge gas from a time t0 for starting supplying the purge gas, until a time t1, when a first target supply flow rate TF1 is obtained. The control unit 17 controls the MFC 24 to maintain the first target supply flow rate TF1 from the time t1 until a time t2.

When the time of purging passes the time t2, the control unit 17 controls the MFC 24 to gradually decrease the flow rate of the purge gas until a second target supply flow rate TF2 is obtained. Specifically, the control unit 17 controls the MFC 24 to continuously decrease the flow rate of the purge gas from the time t2 until a time t3, when the second target supply flow rate TF2 is obtained. The second target supply flow rate TF2 is smaller than the first target supply flow rate TF1, for example, about one fifth of the first target supply flow rate TF1. In the following description, purging at the first target supply flow rate TF1 is referred to as initial purging, whereas purging at the second target supply flow rate TF2 is referred to as maintained purging. The first target supply flow rate TF1 and the second target supply flow rate TF2 may be set as appropriate. The times t1, t2, and t3 may be set as appropriate based on the first target supply flow rate TF1 and the second target supply flow rate TF2.

The control unit 17 controls operations of the MFC 38. For supplying the purge gas at the first target supply flow rate TF1 or the second target supply flow rate TF2 to the storage container F placed on the placing unit 32, the control unit 17 controls the MFC 38, and adjusts the flow rate of the purge gas in the main pipe 37 (the supply pipes 34) to the first target supply flow rate TF1 or the second target supply flow rate TF2. The control unit 17 may control the MFC 38 to gradually increase or decrease the flow rate of the purge gas.

Operations of purging (purging method) in the purge stocker 1 will now be described with reference to FIGS. 5 to 9. In the following description, a first supply unit 20 includes five first purge apparatuses including 21A, 21B, 21C, 21D, and 21E. Four second supply units 30 each have three second purge apparatuses 31.

Figure 5:
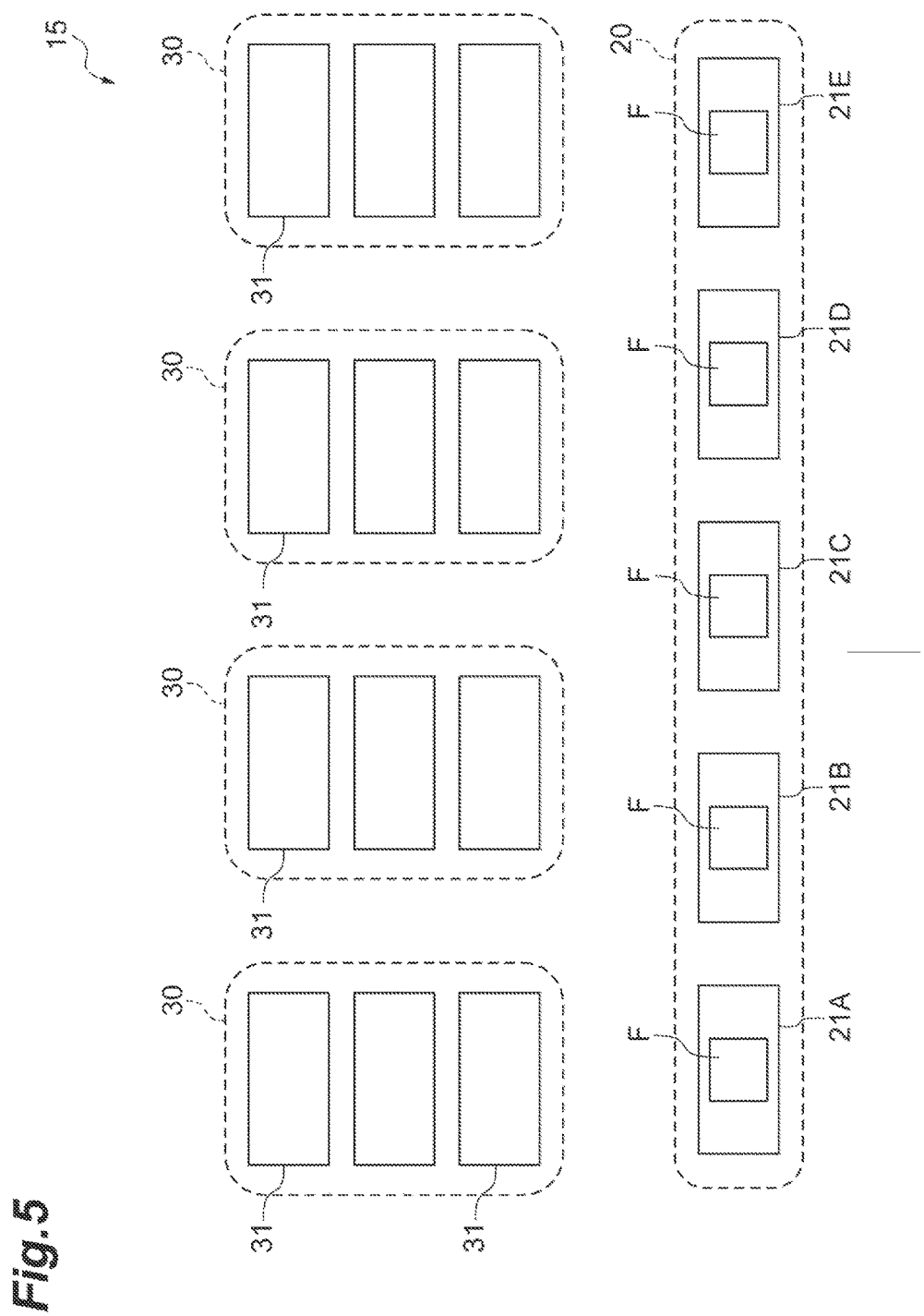
FIG. 5 is an illustrative drawing for an operation of purging in the purge stocker.

When the storage container F is loaded into the purge stocker 1 through, for example, the OHT port 11, the control unit 17 outputs, to the crane 7, a delivery signal instructing to deliver the storage container F to the first supply unit 20. As illustrated in FIG. 5, the crane 7 delivers the storage containers F to the first purge apparatuses 21A to 21E of the first supply unit 20 in response to the delivery signal. The control unit 17 controls the crane 7 to deliver the storage containers F in the order of the first purge apparatus 21A, the first purge apparatus 21B, the first purge apparatus 21C, the first purge apparatus 21D, and the first purge apparatus 21E, in other words, in the order from the first purge apparatus 21A illustrated in the leftmost toward the right side in FIG. 5.

When the first purge apparatuses 21A to 21E have the storage containers F placed on the respective placing units 22, each of the sensing units 25 provided to the placing units 22 outputs a sensing signal informing that the storage container F has been placed on the placing unit 22 to the control unit 17. Upon receipt of the sensing signals, the control unit 17 outputs a signal instructing to start purging to the MFC 24. Upon receipt of the signal, the MFC 24 has the supply pipe 23 start supplying the purge gas to the storage container F. In this case, purging (initial purging) starts in the order that the storage containers F have been placed on the respective placing units 22, in other words, in the order from the first purge apparatus 21A.

Figure 6:
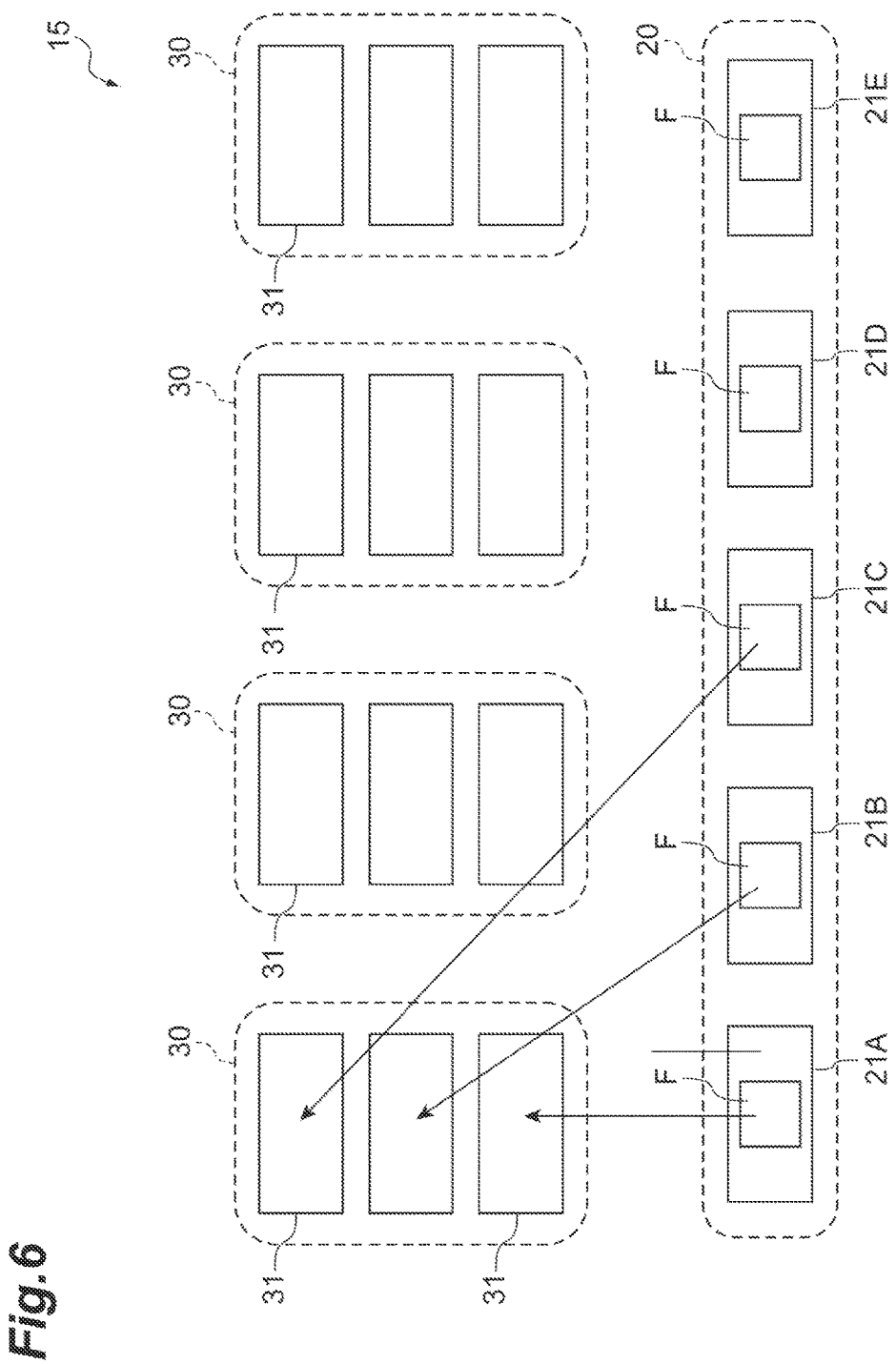
FIG. 6 is a drawing illustrating a timing for transferring a storage container from a first supply system to a second supply system.

As illustrated in FIG. 6, the storage containers F are placed on the placing units 22 of the first purge apparatuses 21A to 21E in respective timings (timings to be delivered) that are different from one another, which accordingly makes the timings for starting purging different from one another. The control unit 17 monitors (obtains) the status of purging performed in the storage containers F in the first purge apparatuses 21A to 21E. Specifically, the control unit 17 measures the time having passed since the start of purging in each of the first purge apparatuses 21A to 21E. In other words, the control unit 17 monitors the status of purging in each of the first purge apparatuses 21A to 21E based on the time having passed since placement of the storage container F on the placing unit 22.

Figure 4:
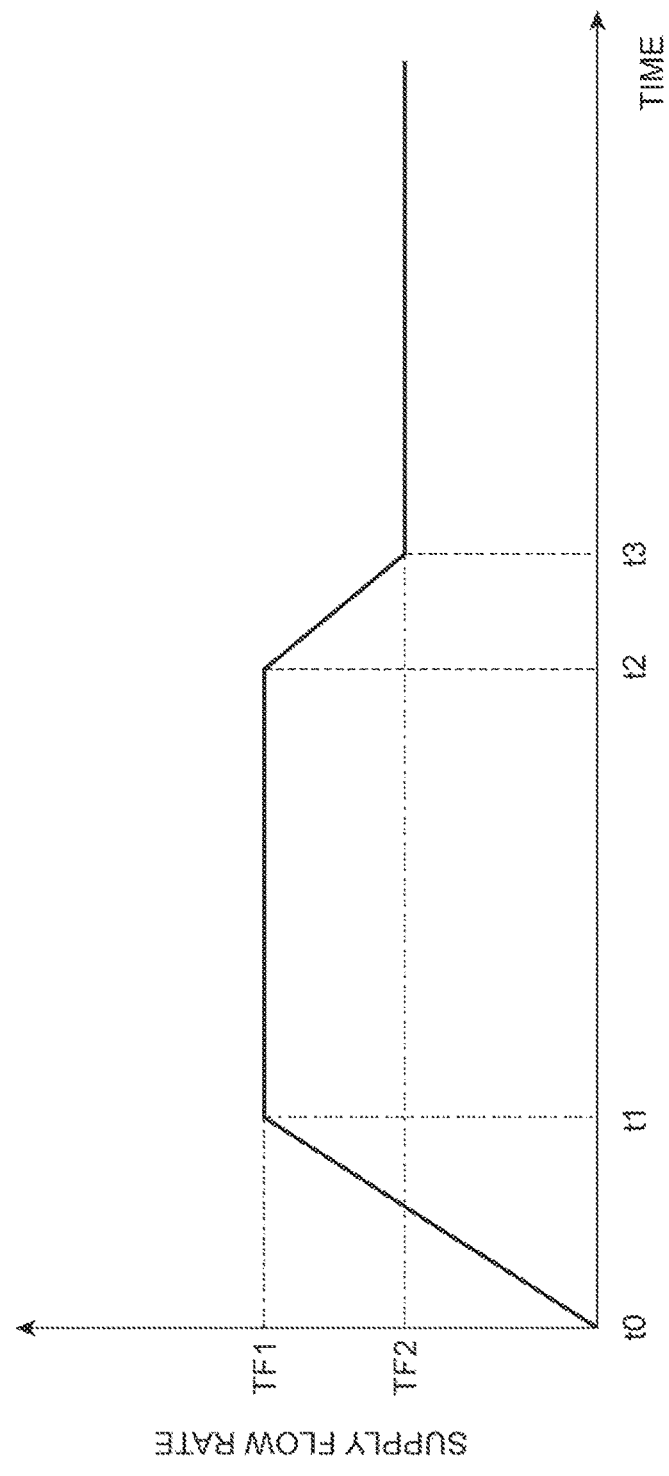
FIG. 4 is an illustrative drawing for a method for supplying purge gas.

As illustrated in FIG. 7, when the number of storage containers F having undergone initial purging in the first supply unit 20 reaches a certain number, which is M (in this case, three) as the number of second purge apparatuses 31 provided in a second supply unit 30, the control unit 17 has the storage containers F transferred to the second purge apparatuses 31 of the second supply unit 30. Specifically, the control unit 17 outputs a delivery signal to the crane 7 when purging in the first purge apparatus 21C turns to maintained purging, as illustrated in FIG. 6 (which means that a time t indicated in FIG. 6 passes the time t3 in FIG. 4). The control unit 17 further controls the MFCs 24 and have the supply pipes 23 of the first purge apparatuses 21A to 21C, from which the storage containers F have been delivered, stop supplying purge gas.

When the storage containers F are placed on the placing units 32 of the second purge apparatuses 31, each of the sensing units 33 provided to the placing units 32 outputs a sensing signal informing that the storage container F has been placed on the placing unit 32 to the control unit 17.

When the control unit 17 confirms that the storage containers F have been delivered to the second supply unit 30 and placed on the placing units 32 of all (the certain number) of the second purge apparatuses 31 based on the sensing signals, the control unit 17 outputs a signal to the MFC 38 and has the supply pipes 34 start supplying purge gas to the storage containers F. In other words, when the control unit 17 receives sensing signals from the sensing units 33 of all of the second purge apparatuses 31 in a second supply unit 30, the control unit 17 outputs a signal to the MFC 38 and has the supply pipes 34 start supplying purge gas to the storage containers F. Out of purging, the second supply unit 30 particularly provides maintained purging.

Figure 8:
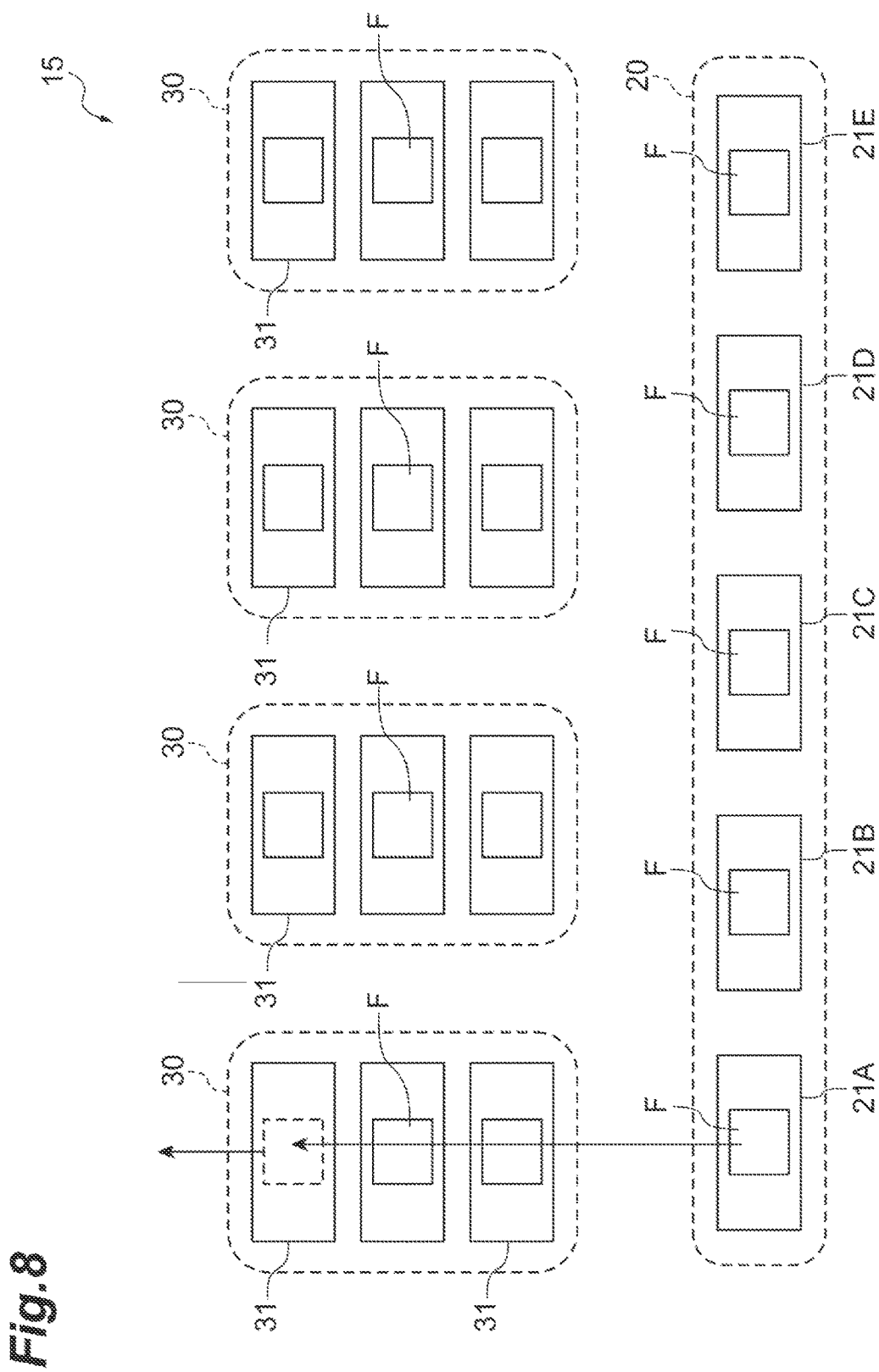
FIG. 8 is an illustrative drawing for an operation of purging in the purge stocker.

As illustrated in FIG. 8, the control unit 17 controls the crane 7 to unload the storage container F from the second supply unit 30 upon receipt of an unloading instruction to unload the storage container F from the upper controller. In the example illustrated in FIG. 8, one of the storage containers F is unloaded. With the unloading process, all the second purge apparatuses 31 in a second supply unit 30 have no storage containers F placed on the placing units 32. As illustrated in FIG. 8, if the first purge apparatus 21A of the first supply unit 20 is performing maintained purging, the control unit 17 has the storage container F transferred from the first purge apparatus 21A to the second supply unit 30. With this operation, all of the second purge apparatuses 31 in the second supply unit 30 have the storage containers F placed on the placing units 32.

As illustrated in FIG. 9, when two storage containers F are unloaded from the second supply unit 30, only one of the placing units 32 of the second purge apparatuses 31 has the storage container F placed thereon in the second supply unit 30. In this case, if the placing unit 22 of the first purge apparatus 21E in the first supply unit 20 has no storage containers F placed thereon, the control unit 17 has the remaining storage container F transferred from the second purge apparatus 31 to the first purge apparatus 21E of the first supply unit 20. With this process, all of the second purge apparatuses 31 in the second supply unit 30 have no storage containers F placed on the placing units 32. The control unit 17 controls the MFC 38 of the second supply unit 30 to have the supply pipes 34 (the main pipe 37) stop supplying purge gas. If two or more storage containers F from among the first purge apparatuses 21A to 21E in the first supply unit 20 have maintained purging, the control unit 17 may have the storage containers F transferred from the first supply unit 20 to the second supply unit 30.

As described above, in the purge stocker 1 of this embodiment, the second supply unit 30 has each of the supply pipes 34 supply the purge gas to the corresponding storage container F when all of the placing units 32 have the storage containers F placed thereon. In other words, if none of the placing units 32 have the storage containers F, the second supply unit 30 performs no purging. This configuration can control discharge of the purge gas and accordingly reduce the consumption of the purge gas. Furthermore, no purge nozzles in a complicated configuration are necessary, which can make the configuration simple.

In this embodiment, when the number of storage containers F having undergone initial purging in the first supply unit 20 reaches M, the control unit 17 controls the crane 7 to transfer the M storage containers F from the first supply unit 20 to the second supply unit 30. Upon completion of the transfer of the M storage containers F, the second supply unit 30 has each of the supply pipes 34 supply the purge gas to the corresponding storage container F. However, the storage containers F having undergone initial purging are sequentially transferred from the first supply unit 20 to the second supply unit 30, which may take some time, until all of the placing units 32 of the second purge apparatuses 31 have the storage containers F placed thereon. In this case, no purge gas is supplied to the storage containers F having been earlier transferred to the second supply unit 30 until transferring remaining storage containers F is completed. With this configuration, however, the environment inside the storage container F may not be kept in good condition. To overcome the problem, when the number of storage containers F having undergone initial purging reaches M in the first supply unit 20, these storage containers F are transferred to the second supply unit 30. This process can reduce the time during which no purge gas is supplied to the storage containers F.

In this embodiment, the second supply unit 30 includes the main pipe 37 having a plurality of second supply pipes 34 connected thereto and supplying the purge gas to each of the second supply pipes 34 and the MFC 38 adjusting the flow rate of the purge gas in the main pipe 37. This configuration allows adjustment of the flow rate of the purge gas supplied to the supply pipe 34. Furthermore, the main pipe 37 is provided with only one MFC 38. This configuration can make the device simple and thus can control an increase in the cost compared with the configuration providing the MFC to each of the supply pipes 34. Furthermore, for example, when the purge stocker 1 is started after having a power outage or the like, initial purging may be performed on the storage container F in the second supply unit 30. In this case, the MFC 38 provided to the main pipe 37 can gradually increase the flow rate of the purge gas supplied from the supply pipe 34 to the storage container F. This configuration can reduce dust swirling inside the storage container F.

In this embodiment, in starting supplying the purge gas to the storage container F, the MFC 24 increases the flow rate of the purge gas in the supply pipe 23 in a continuous or stepwise manner to obtain the first target supply flow rate TF1. This configuration can reduce dust swirling inside the storage container F.

In this embodiment, upon control of the control unit 17, the crane 7 delivers the storage container F out of the second supply unit 30 and transfers as many storage containers F as the delivered storage containers F from the first supply unit 20 to the second supply unit 30. With this configuration, the second supply unit 30 always includes M storage containers F. Consequently, the purge gas is supplied to the storage containers F with all of the supply pipes 34 connected with the respective storage containers F. Consequently, this configuration can reduce the consumption of the purge gas, and accurately supply the purge gas to the storage containers F.

The present invention, however, is not limited to the above-described embodiment. In the above-described embodiment, such an exemplary configuration has been described that, when a storage container F is delivered out of a second supply unit 30, another storage container F is transferred from the first supply unit 20 to the second supply unit 30 or from the second supply unit 30 to the first supply unit 20. In another embodiment, as illustrated in FIG. 10, when a storage container F is delivered out of the second supply unit 30, an empty storage container FD may be transferred from a shelf 50 storing empty storage containers FD having no products therein to the second supply unit 30. This configuration allows the second supply unit 30 to supply the purge gas with the placing unit 32 of each of the second purge apparatuses 31 having the storage container F or FD placed thereon.

In the above-described embodiment, the supply pipes 34 supply the purge gas to the storage containers F when all of the second purge apparatuses 31 in the second supply unit 30 have storage containers F placed on the respective placing units 32. In another case, even when not all the second purge apparatuses 31 have the storage containers F placed on the respective placing units 32, the supply pipes 34 may supply the purge gas to the storage containers F as long as a certain number of placing units 32 have the storage containers F placed thereon. The certain number is, for example, 80% or more of all the placing units 32. In this case, the control unit 17 controls the MFC 38 to increase the flow rate of the purge gas in the main pipe 37. Specifically, the control unit 17 sets the flow rate of the purge gas based on the number of storage containers F connected with respective supply pipes 34 of the second purge apparatuses 31. For example, when a second supply unit 30 is provided with three second purge apparatuses 31, the set flow rate is calculated by multiplying the target supply flow rate (for example, 10 liters per minute) by the number of storage containers F (in this case, three as the number of placing units 32) connected with the respective supply pipes 34. If not all the supply pipes 34 are connected with the storage containers F, the flow rate is set with an increase from the usual set flow rate. This configuration enables the storage container F to be supplied with a constant amount of the purge gas even when the purge gas is discharged from the second supply pipe 34 connected with no storage containers F.

In the embodiment, such an exemplary configuration has been described that the sensing unit 25 (the sensing unit 33) senses that the storage container F has been placed on the placing unit 22 (the placing unit 32); however, the method for finding (sensing) placement of the storage container F is not limited to this method. For example, the control unit 17 may find that the storage container F has been placed on the placing unit 22 (the placing unit 32) based on the operation (information on the delivery instruction) of the crane 7.

In the embodiment, such an exemplary configuration has been described that has the supply pipe 34 supply the purge gas to the storage container F when the storage container F is placed on (supported by) the placing unit 32. In another case, the purge gas may be supplied when the storage container F is determined to be supported by the supporting unit 32, for example, when a transfer instruction is output to the crane 7.

In the embodiment, such an exemplary configuration has been described that the MFC 38 is provided to the main pipe 37 of the second supply unit 30; however, the MFC 38 may not be provided. The main pipe 37 may be provided with a regulator instead of the MFC 38.

In the embodiment, such an exemplary configuration has been described that the orifice 36 is formed on the supply pipe 34 of the second purge apparatus 31; however, no orifices 36 may be formed.

REFERENCE SIGNS LIST

1 . . . purge stocker, 7 . . . crane (transferring device), 17 . . . control unit, 20 . . . first supply unit, 21 . . . first purge apparatus, 22 . . . placing unit (first supporting unit), 23 . . . supply pipe (first supply pipe), 24 . . . MFC (first flow rate adjusting unit), 30 . . . second supply unit, 31 . . . second purge apparatus, 32 . . . placing unit (second supporting unit), 34 . . . supply pipe (second supply pipe), 37 . . . main pipe, 38 . . . MFC (second flow rate adjusting unit), F . . . storage container, FD . . . empty storage container

The invention claimed is:

1. A purge stocker for purging an inside of storage containers which store a product with purge gas, the purge stocker comprising:
a first supply unit including N first purge apparatuses, wherein N is an integer equal to or larger than 2, each of the N first purge apparatuses having a first supporting unit configured to support one of the storage containers, a first supply pipe configured to supply the purge gas to the one of the storage containers supported by the first supporting unit, and a first flow rate adjusting unit positioned to measure a mass flow rate of the purge gas in the first supply pipe, and individually provide flow rate control;
a second supply unit including:
M second purge apparatuses and M second supply pipes correspondingly associated with each of the M second purge apparatuses, wherein M is a positive integer between 2 and N, inclusive, each of the M second purge apparatuses having a second supporting unit configured to support the one of the storage containers, and one of the M second supply pipes configured to supply the purge gas to the one of the storage containers supported by the second supporting unit,
a main pipe connected with, and configured to supply the purge gas to, each of the M second supply pipes, and
a single second flow rate adjusting unit positioned on the main pipe to measure a mass flow rate of the purge gas flowing through the main pipe, to the each of the M second supply pipes, and then to each of the one of the storage containers associated with the second flow rate adjusting unit and provide collective flow rate control;
a transferring device configured to transfer the one of the storage containers from the first supply unit to the second supply unit, once initial purging is complete, for maintained purging in the second supply unit, wherein
the second flow rate adjusting unit controls a flow rate of the purge gas supplied to each of the M second supply pipes of the each of the M second purge apparatuses, and then to the each of the one of the storage containers, and
the second supply unit supplies the each of the one of the storage containers with the purge gas through the M second supply pipes when the each of the one of the storage containers are supported by an associated second supporting unit.

2. The purge stocker according to claim 1, wherein, when all of the second supporting units in the M second purge apparatuses support a respective one of the storage containers, the second supply unit supplies the respective one of the storage containers with the purge gas through the one of the M second supply pipes.

3. The purge stocker according to claim 2, wherein
when a number of storage containers that have been supplied with the purge gas are at a certain flow rate for a certain period in the first supply unit reaches M, the transferring device transfers M ones of the storage containers from the first supply unit to the second supply unit, and
upon completion of transfer of the M ones of the storage containers, the second supply unit supplies the storage containers with the purge gas through the M second supply pipes.

4. The purge stocker according to claim 1, wherein the second flow rate adjusting unit adjusts the flow rate of the purge gas in the main pipe to a set flow rate that is determined based on a number of the storage containers connected with the M second supply pipes in the second supply unit.

5. The purge stocker according to claim 1, wherein, when starting supplying the purge gas to the one of the storage containers, the first flow rate adjusting unit increases the flow rate of the purge gas in the first supply pipe in a continuous or stepwise manner to obtain a certain supply flow rate.

6. The purge stocker according to claim 1, wherein, when at least one of the storage containers is delivered out of the second supply unit, the transferring device transfers as many storage containers as the storage containers delivered from the first supply unit to the second supply unit.

7. The purge stocker according to claim 6, further comprising:
one or more empty storage containers storing no products, wherein
when at least one of the storage containers is delivered out of the second supply unit, the transferring device transfers as many empty storage containers as the storage containers delivered to the second supply unit.

8. The purge stocker according to claim 1, wherein the purge stocker further comprises a control unit which controls operations of the first flow rate adjusting unit and the second flow rate adjusting unit, wherein
each of the M second supply pipes is connected to the main pipe,
the second flow rate adjusting unit is provided further upstream in terms of purge gas flow than each portion connected to the each of the M second supply pipes in the main pipe, and
the control unit controls the second flow rate adjusting unit in the second supply unit so as to supply the purge gas to the each of the ones of the storage containers via the each of the M second supply pipes when the each of the ones of the storage containers is supported by each of the second supporting units.

9. A purging method for a purge stocker that is configured to purge an inside of storage containers storing a product with purge gas, the purge stocker including: a first supply unit including N first purge apparatuses, wherein N is an integer equal to or larger than 2, each of the N first purge apparatuses having a first supporting unit configured to support one of the storage containers, and a second supply unit including M second purge apparatuses and M second supply pipes associated with each of the M second purge apparatuses, wherein M is a positive integer between 2 and N, inclusive, each of the M second purge apparatuses having a second supporting unit configured to support the one of the storage containers, the purging method comprising:
supplying the purge gas, via a first supply pipe, to the one of the storage containers supported by the first supporting unit;
measuring, via a first flow rate adjusting unit, a mass flow rate of the purge gas in the first supply pipe;
controlling, via the first flow rate adjusting unit, a mass flow rate of the purge gas through the first supply pipe individually;
supplying the purge gas to the one of the storage containers supported by the second supporting unit by supplying the purge gas to a main pipe connected with one of the M second supply pipes and configured to supply the purge gas to the one of the second supply pipes;
measuring, via a second flow rate adjusting unit, a mass flow rate of the purge gas in the main pipe;
controlling, via the second flow rate adjusting unit, a mass flow rate of the purge gas;
transferring the one of the storage containers from the first supply unit to the second supply unit, once initial purging is complete, for maintained purging in the second supply unit;
collectively controlling a flow rate of the purge gas supplied to the main pipe of the M second purge apparatuses, to each of the M second supply pipes of the M second purge apparatuses, and then to each of the one of the storage containers associated with the second flow rate adjusting unit; and
when the each of the one of the storage containers are supported by the second supporting units, supplying the each of the one of the storage containers with the purge gas through the each of the M second supply pipes in the second supply unit.

* * * * *